(12) United States Patent
Matsui

(10) Patent No.: US 6,862,483 B2
(45) Date of Patent: Mar. 1, 2005

(54) APPARATUS FOR CHANGING PULSE WIDTH MODULATION AT DESIRED TIMING

(75) Inventor: Satoshi Matsui, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 389 days.

(21) Appl. No.: 09/814,758

(22) Filed: Mar. 23, 2001

(65) Prior Publication Data
US 2002/0059004 A1 May 16, 2002

(30) Foreign Application Priority Data
Nov. 14, 2000 (JP) ........................................ 2000-346981

(51) Int. Cl.⁷ ............................................. G05B 13/02
(52) U.S. Cl. ................... 700/39; 327/164; 327/165; 327/291; 327/106; 327/113; 327/114; 377/47; 377/96; 375/214; 713/500
(58) Field of Search ........................... 700/39, 327/164, 327/165, 291, 106, 113, 114; 377/47, 96; 375/214; 713/500

(56) References Cited

U.S. PATENT DOCUMENTS 5,357,219 A * 10/1994 Fujii ........................... 332/109
5,416,434 A * 5/1995 Kootstra et al. ............. 327/113
5,524,123 A * 6/1996 Staiger ........................ 375/238
5,598,552 A * 1/1997 Fotouhi et al. .............. 711/167
6,396,317 B1 * 5/2002 Roller et al. ................. 327/113

FOREIGN PATENT DOCUMENTS

| DE | 44 03 732 C1 | 10/1995 | |
| EP | 0 657 988 A2 | 6/1995 | |
| JP | 04069068 A * | 3/1992 | ............ H02M/7/48 |

* cited by examiner

Primary Examiner—Anthony Knight
Assistant Examiner—Thomas Pham
(74) Attorney, Agent, or Firm—Staas & Halsey LLP.

(57) ABSTRACT

A device generating a pulse signal includes at least one first register which stores waveform data therein, a pulse signal generation unit which generates a pulse signal in accordance with the waveform data of the first register, a control unit which is connected to a bus, and is controlled by control signals supplied from the bus, and a signal line which is separate from and independent of the bus, and is connected to the control unit, wherein the control unit updates the waveform data of the first register in response to a signal that is externally supplied through the signal line.

11 Claims, 6 Drawing Sheets

US 6,862,483 B2

APPARATUS FOR CHANGING PULSE WIDTH MODULATION AT DESIRED TIMING

BACKGROUND OF THE INVENTION

1. Field of the Invention

The present invention generally relates to PWM (pulse width modulation) apparatuses that output a pulse signal based on pulse width modulation, and particularly relates to a PWM apparatus that modifies a pulse waveform at a predetermined timing.

2. Description of the Related Art

A PWM (pulse width modulation) apparatus outputs a pulse signal having a specified cycle and a specified duty ratio. The pulse signal output from the PWM apparatus may be used to control motor revolution for the purpose of attending to auto-focus control of a camera apparatus or the like. In general, a CPU accesses the PWM apparatus to change the cycle and duty ratio, thereby controlling the waveform of the output pulse signal.

When there is a need to modify the waveform of a pulse signal in response to an external event such as a trigger from a timer, the timer generates an interruption to the CPU. In response, the CPU executes an interruption routine, and updates data of the PWM waveform stored in the PWM apparatus by using a bus as an access route. When the data of PWM waveform is updated via the bus, the waveform of a pulse signal output from the PWM apparatus changes accordingly.

When the CPU is attending to other processes having higher priority or other interruption processes, response to the interruption from the timer or the like is delayed, resulting in undesirable fluctuation in the timing at which the data of PWM waveform is updated.

Accordingly, there is a need for a PWM apparatus which can change the PWM waveform at a desired timing.

SUMMARY OF THE INVENTION

It is a general object of the present invention to provide a PWM apparatus that substantially obviates one or more of the problems caused by the limitations and disadvantages of the related art.

It is another and more specific object of the present invention to provide a PWM apparatus which can change the PWM waveform at a desired timing.

To achieve these and other advantages and in accordance with the purpose of the invention, as embodied and broadly described herein, a device for generating a pulse signal according to the present invention includes at least one first register which stores waveform data therein, a pulse signal generation unit which generates a pulse signal in accordance with the waveform data of the first register, a control unit which is connected to a bus, and is controlled by control signals supplied from the bus, and a signal line which is separate from and independent of the bus, and is connected to the control unit, wherein the control unit updates the waveform data of the first register in response to a signal that is externally supplied through the signal line.

In the device for generating a pulse signal as described above, when there is a need to modify the pulse signal waveform in response to an external event, the external signal is supplied to the control unit through the signal line that is directly connected to the control unit independently from the bus. In response, the control unit updates the waveform data such as duty data and cycle data stored in the registers, thereby effecting a change in the PWM waveform of the output pulse signal. In this manner, it is possible to modify the PWM waveform at a desired timing indicated by an external event.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
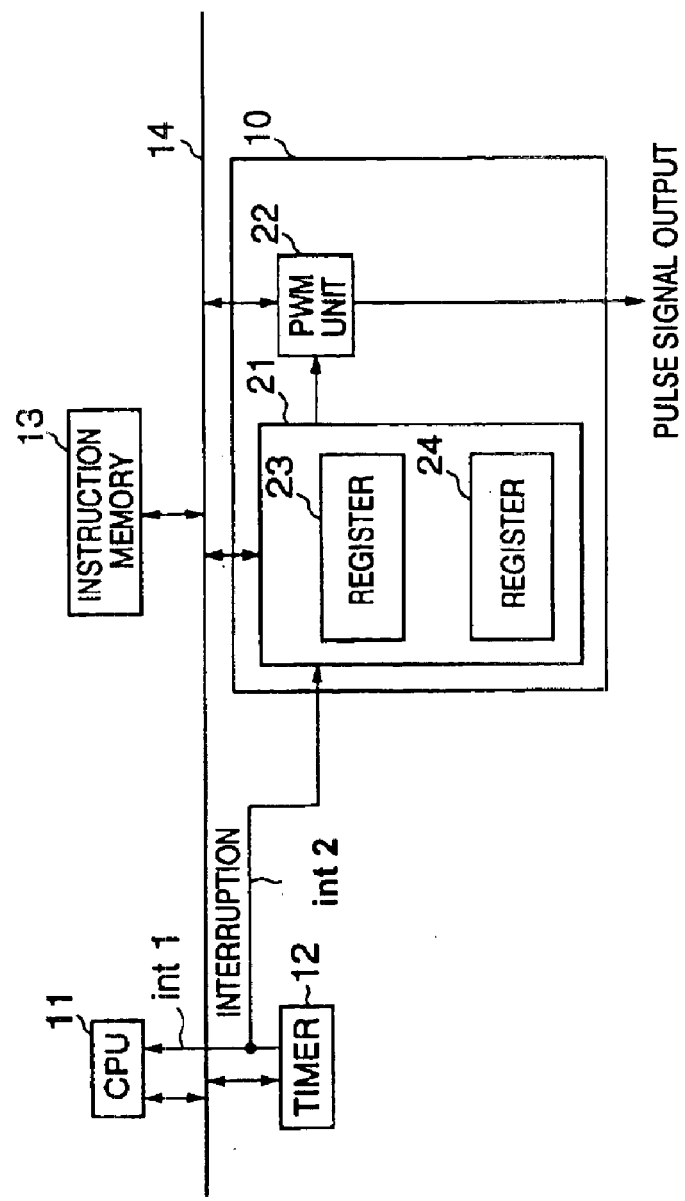
FIG. 1 is a block diagram of a PWM system according to the present invention.

FIG. 1 is a block diagram of a PWM system according to the present invention.

The system of FIG. 1 includes a PWM apparatus 10, a CPU 11, a timer 12, an instruction memory 13, and a CPU bus 14. The PWM apparatus 10, the CPU 11, the timer 12, and the instruction memory 13 are connected together via the CPU bus 14.

The CPU 11 operates based on programs that are a series of instructions stored in the instruction memory 13. The timer 12 is controlled by the CPU 11, for example, via the CPU bus 14, and marks time by counting clock pulses or the like. When detecting an arrival of a preset time such as at an end of a predetermined time interval, the timer 12 generates an interruption signal. The interruption signal is supplied to the CPU 11 via an interruption signal line int1 and to the PWM apparatus 10 via an interruption signal line int2.

The PWM apparatus 10 is connected to the CPU bus 14, and is controlled by the CPU 11. Further, the PWM apparatus 10 receives the interruption signal from the timer 12 via the interruption signal line int2. The PWM apparatus 10 includes a PWM unit 22 and a control unit 21 where the PWM unit 22 has substantially the same configuration as a conventional PWM unit, and the control unit 21 includes registers 23 and 24. The control unit 21 receives the interruption signal from the timer 12 via the interruption signal line int2, and, in response, supplies a duty setting and a cycle setting stored in the respective registers 23 and 24 to the PWM unit 22. The PWM unit 22 stores the received duty setting and cycle setting in internal registers, and outputs a pulse signal in accordance with the renewed settings. With this, the output pulse signal is changed from an old PWM waveform to a new PWM waveform.

Upon receiving an interruption signal from the timer 12 through the interruption signal line int1, the CPU 11 obtains a duty ratio and a cycle for a next PWM waveform, for example, based on computation or data stored in a memory. The CPU 11 supplies the duty ratio and the cycle to the PWM apparatus 10 through the CPU bus 14. The transferred duty ratio and cycle are stored in the respective registers 23 and 24 of the control unit 21 as a duty ratio and a cycle for a next PWM waveform, for example. The duty ratio and cycle that are stored in the respective registers 23 and 24 in response to the interruption from the timer 12 to the CPU 11 are provided as preparation for an immediately following interruption, for example. Namely, after the duty setting and the cycle setting are supplied from the registers 23 and 24 to the PWM unit 22 in response to the current interruption that is supplied from the timer 12 to the PWM apparatus 10, data to be used for the next interruption is stored in the registers 23 and 24 in response to the current interruption issued from the timer 12 to the CPU 11.

The registers 23 and 24 may be implemented by using FIFOs or sets of registers. In this case, the CPU 11 responds to the interruption sent from the timer 12 via the interruption signal line int1 by supplying a duty ratio and a cycle that are to be used for a second next interruption, a third next interruption, etc., instead of a next and immediately following interruption. Namely, the registers 23 and 24 may not be registers each for storing a single piece of data therein, but may serve as register queues for storing a series of data pieces such as next data, second next data, third next data, and so on.

If the CPU 11 can generate next data reliably prior to a next event of interruption and can supply the data to the PWM apparatus 10, there is not necessarily a need to await an interruption signal supplied from the timer 12 via the interruption signal line int1 before supplying data. Further, if register queues are employed, and if it is possible for the CPU 11 to compute data for future needs beforehand, the CPU 11 may compute data for next ten interruptions, for example, and may supply the data through the CPU bus 14 to the PWM apparatus 10, thereby storing the data for the next ten interruptions in the register queues at once.

In the present invention as described above, when there is a need to modify the pulse signal waveform in response to an external event such as a trigger from the timer 12, the interruption signal from the timer 12 is directly supplied to the PWM apparatus 10. In response, the PWM apparatus 10 supplies settings such as the duty setting and the cycle setting stored in the registers to the PWM unit 22, which is used to actually generate a pulse signal. This achieves a change in the PWM waveform of the output pulse signal. In this manner, it is possible to modify the PWM waveform at a desired timing indicated by an external event such as a trigger from the timer 12. The settings such as the duty setting and the cycle setting stored in the registers of the PWM apparatus 10 are supplied from the CPU 11 to the PWM apparatus 10 via the CPU bus 14 in response to an interruption signal issued by the timer 12, for example. The settings of data may be made successively for the immediately following interruption, or may be made at once with respect to data for a plurality of future interruptions.

Figure 2:
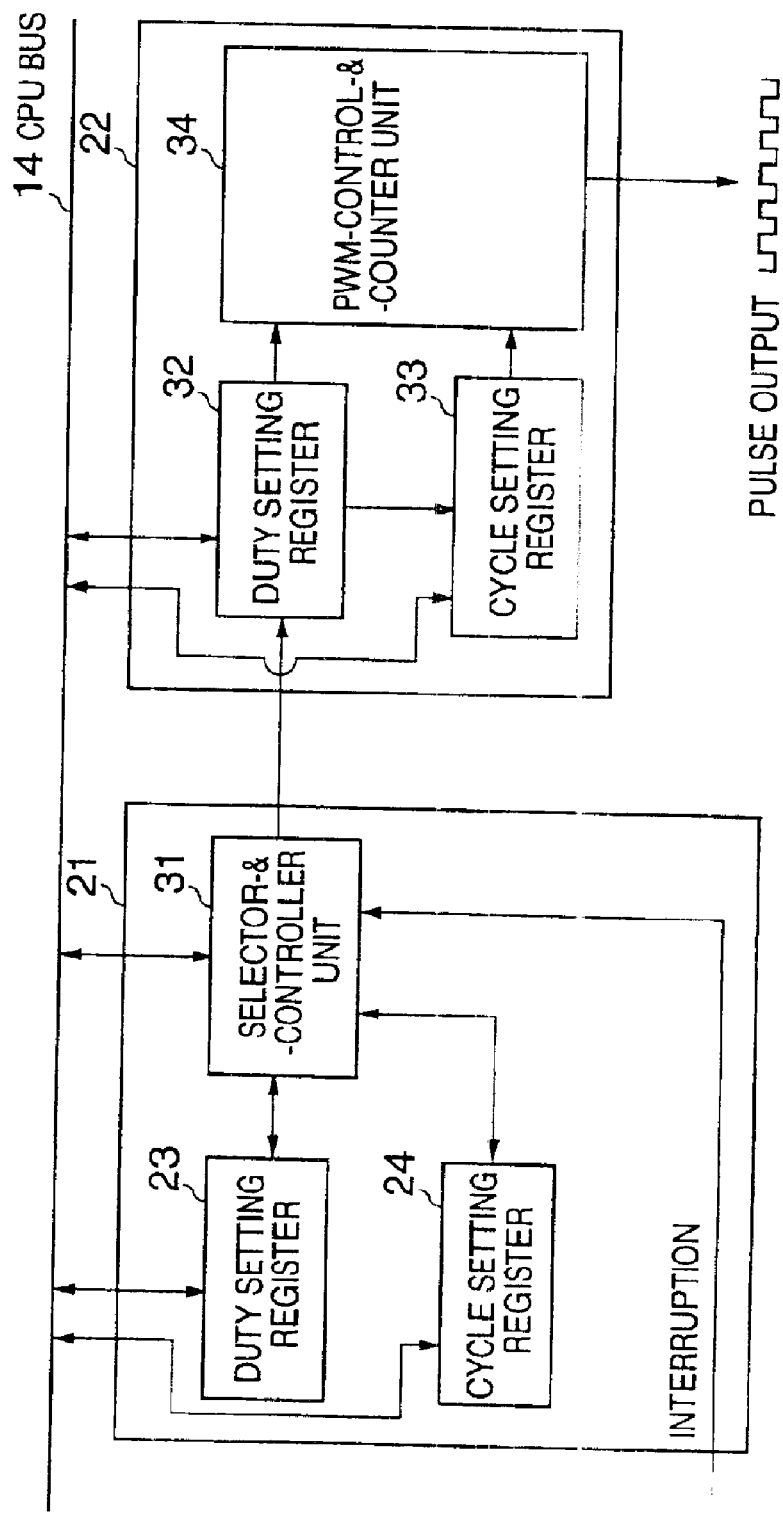
FIG. 2 is a block diagram of a first embodiment of a PWM apparatus according to the present invention.

FIG. 2 is a block diagram of a first embodiment of the PWM apparatus 10 according to the present invention. In FIG. 2, the same elements as those of FIG. 1 are referred to by the same numerals, and a description thereof will be omitted.

As shown in FIG. 2, the control unit 21 includes the duty setting register 23 and the cycle setting register 24. Further, the control unit 21 includes a selector-&-controller unit 31.

The duty setting register 23 and the cycle setting register 24 are directly connected to the CPU bus 14, and receive duty data and cycle data, respectively, from the CPU 11 through the CPU bus 14. The CPU bus 14 includes an address bus, a data bus, and a control signal bus for conveying a chip selecting signal, a read/write signal, and the like.

The selector-&-controller unit 31 receives control signals from the control signal bus, and controls data write/read operations in respect of the duty setting register 23 and the cycle setting register 24 in accordance with the received control signals. Further, the selector-&-controller unit 31 receives an interruption signal from the timer 12, and controls data transfer operations for transferring data from the duty setting register 23 and the cycle setting register 24 to the PWM unit 22 in accordance with the received interruption signal.

The PWM unit 22 includes a duty setting register 32, a cycle setting register 33, and a PWM-control-&-counter unit 34. The duty setting register 32 and the cycle setting register 33 are directly connected to the CPU bus 14. The PWM-control-&-counter unit 34 operates as a unit that generates a pulse signal, and generates a pulse signal in accordance with the data stored in the duty setting register 32 and the cycle setting register 33, thereby outputting the pulse signal to the exterior of the device. The PWM unit 22 has substantially the same configuration as a conventional PWM apparatus, and is capable of modifying the PWM waveform of the pulse signal output under the control of the CPU in accordance with the data stored in the duty setting register 32 and the cycle setting register 33 in the same manner as in the conventional art. Specific to the present invention, the PWM unit 22 is additionally configured such that the duty setting register 32 allows data thereof to be written by the selector-&-controller unit 31.

Figure 3:
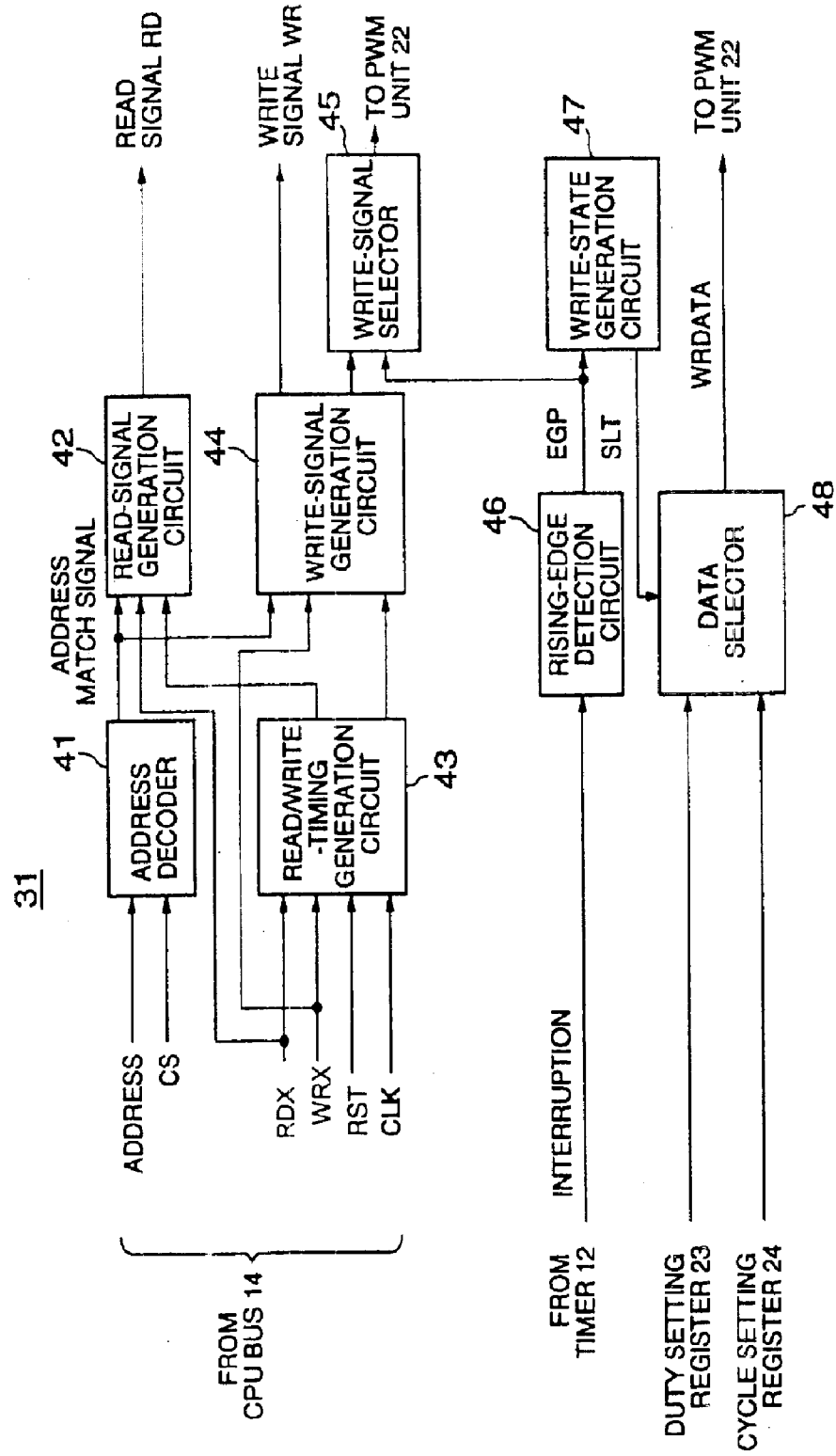
FIG. 3 is a block diagram showing an example configuration of a selector-&-controller unit.

FIG. 3 is a block diagram showing a example configuration of the selector-&-controller unit 31.

The selector-&-controller unit 31 includes an address decoder 41, a read-signal generation circuit 42, a read/write-timing generation circuit 43, a write-signal generation circuit 44, a write-signal selector 45, a rising-edge detection circuit 46, a write-state generation circuit 47, and a data selector 48.

Figure 4:
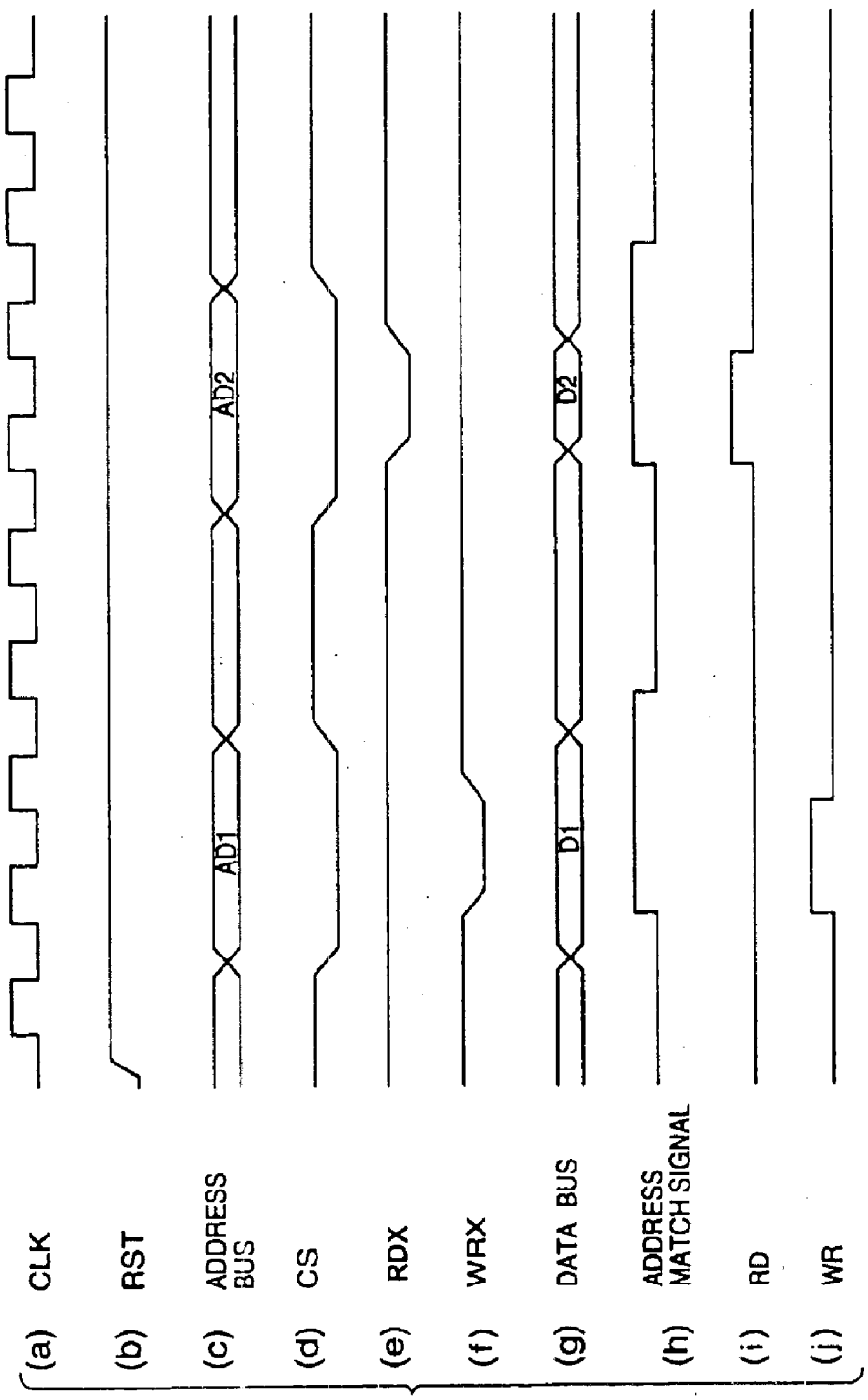
FIG. 4 is a timing chart for explaining operations of the selector-&-controller unit of FIG. 3 when data is written in and read from a duty setting register and a cycle setting register.

FIG. 4 is a timing chart for explaining operations of the selector-&-controller unit 31 of FIG. 3 when data is written in and read from the duty setting register 23 and the cycle setting register 24. In the following, data read/write operations with respect to the register queues will be described with reference to FIG. 2, FIG. 3, and FIG. 4.

Various types of control signals are supplied from the CPU 11 to the selector-&-controller unit 31 of the control unit 21 through the CPU bus 14. These control signals include a chip selecting signal CS, a read signal RDX, a write signal WRX, a reset signal RST, and a clock signal CLK. The chip selecting signal CS is supplied to the address decoder 41. The read signal RDX, the write signal WRX, the reset signal RST, and the clock signal CLK are supplied to the read/write-timing generation circuit 43. Address signals are conveyed through the address bus of the CPU bus 14 in synchronization with the chip selecting signal CS, and are supplied to the address decoder 41. In FIG. 4, (a) through (f) show timing relations between these signals.

The address decoder 41 receives the address signals in addition to the chip selecting signal CS, and decodes the received address. The address decoder 41 generates an address match signal as shown in (f) of FIG. 4 when the chip selecting signal CS selects this chip among other chips while the received address matches an address of the register of the PWM apparatus 10. The address match signal is supplied to the read-signal generation circuit 42 and the write-signal generation circuit 44.

Based on the clock signal CLK, the read/write-timing generation circuit 43 generates a read timing signal indicative of a timing of a read operation, and generates a write timing signal indicative of a timing of a write operation. The read timing signal is supplied to the read-signal generation circuit 42, and the write timing signal is supplied to the write-signal generation circuit 44.

The read-signal generation circuit 42 generates a read signal RD (as shown in FIG. 4, (i)) at a timing specified by the read timing signal when the read signal RDX indicates a read operation while the address match signal is activated. The write-signal generation circuit 44 generates a write signal WR (as shown in FIG. 4, (j)) at a timing specified by the write timing signal when the write signal WRX indicates a write operation whilst the address match signal is activated. These read signal RD and write signal WR are supplied to the duty setting register 23 and the cycle setting register 24, thereby ordering a read operation and a write operation in respect of these registers. As the read signal RD orders a read operation, data is read from the register of an indicated address, and is output to the data bus of the CPU bus 14. As the write signal WR orders a write operation, data conveyed through the data bus of the CPU bus 14 is written in the register queue at an indicated address. The data signal of the data bus is shown in FIG. 4, (g).

In the manner as described above, the CPU 11 carries out a data write operation and a data read operation in respect of the duty setting register 23 and the cycle setting register 24 of the control unit 21. By the same token, the CPU 11 may perform a data write operation and a data read operation with respect to the duty setting register 32 and the cycle setting register 33 of the PWM unit 22.

Figure 5:
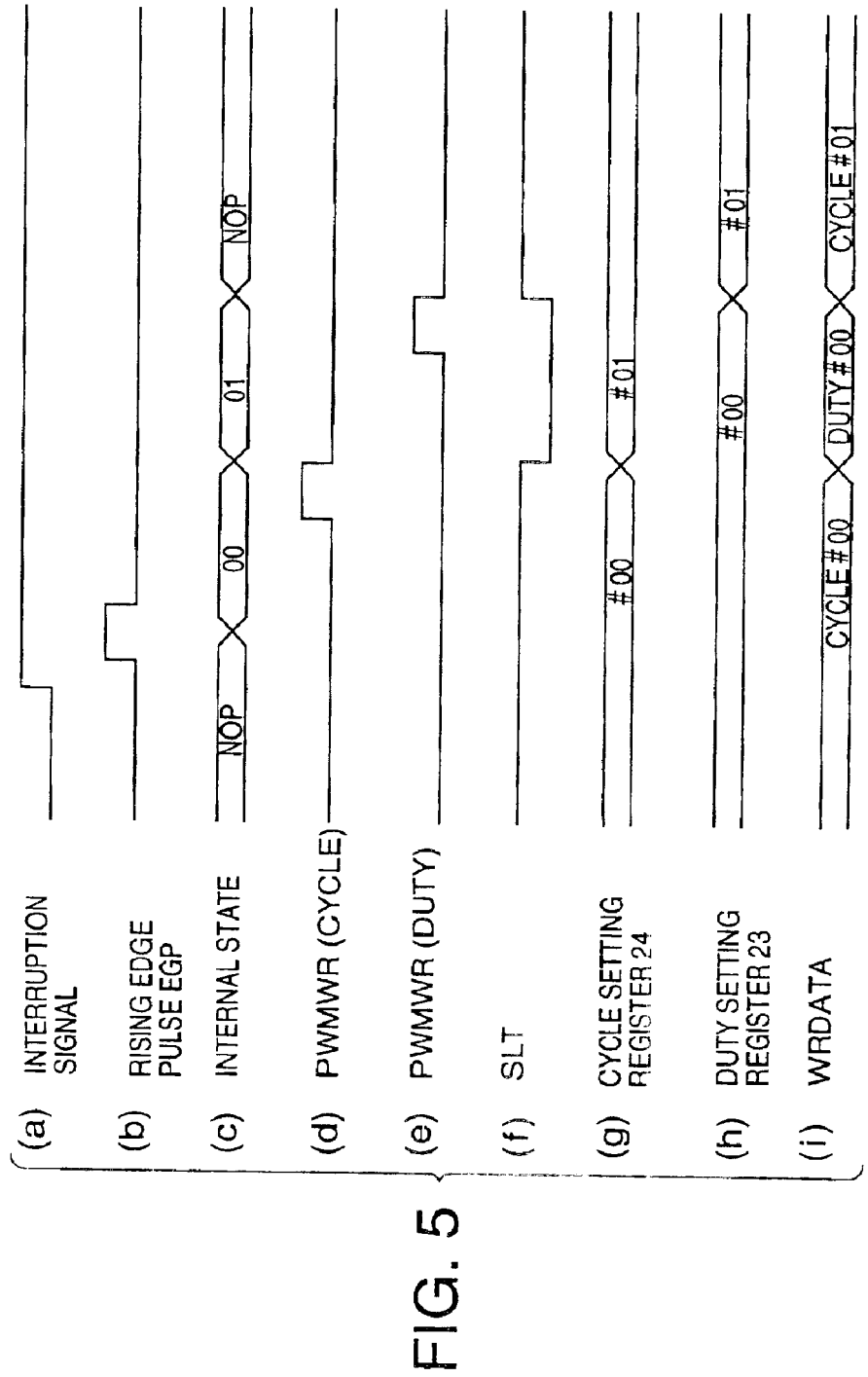
FIG. 5 is a timing chart for explaining operations performed by the selector-&-controller unit when a timer generates an interruption signal.

FIG. 5 is a timing chart for explaining operations performed by the selector-&-controller unit 31 when the timer 12 generates an interruption signal. Operations of modifying the waveform of a pulse signal will be described with reference to FIG. 2, FIG. 3, and FIG. 5.

The interruption signal generated by the timer 12 arrives at the selector-&-controller unit 31 of the control unit 21. The interruption signal arriving at the selector-&-controller unit 31 is supplied to the rising-edge detection circuit 46. The rising-edge detection circuit 46 detects a rising edge of the interruption signal to generate a rising edge pulse EGP. The rising edge pulse EGP is supplied to the write-signal selector 45 and the write-state generation circuit 47. In response to the rising edge pulse EGP, the write-signal selector 45 generates write signals PWMWR respectively for the cycle setting purpose and for the duty setting purpose, and these generated signals are supplied to the PWM unit 22. The write-state generation circuit 47, responsive to the rising edge pulse EGP, changes an internal state thereof, and generates a selection signal SLT accordingly. The selection signal SLT is supplied to the data selector 48. The interruption signal, the rising edge pulse EGP, the internal state of the write-state generation circuit 47, the write signal PWMWR for the cycle setting, the write signal PWMWR for the duty setting, and the selection signal SLT described above are shown in FIG. 5, (a) through (f), respectively.

The data selector 48 selects data of a register indicated by the selection signal SLT. When the selection signal SLT is HIGH, for example, data of the cycle setting register 24 is selected. When the selection signal is LOW, on the other hand, data of the duty setting register 23 is selected. In the example shown in FIG. 5, (f), the selection signal SLT is HIGH when the data of the cycle setting register 24 is to be selected, and is LOW when the data of the duty setting register 23 is to be selected. As the data selector 48 selects data from the cycle setting register 24, the write data WRDATA (FIG. 5, (i)) supplied to the PWM unit 22 turns into data CYCLE#00 that is the first data of the cycle setting register 24. As the data selector 48 selects data from the duty setting register 23, the write data WRDATA (FIG. 5, (i)) supplied to the PWM unit 22 turns into data DUTY#00 that is the first data of the duty setting register 23.

The data CYCLE#00 of the write data WRDATA that is the first data of the cycle setting register 24 is stored in the cycle setting register 33 in response to the write signal PWMWR for the cycle setting (FIG. 5, (d)). The data DUTY#00 of the write data WRDATA that is the first data of the duty setting register 23 is stored in the duty setting register 32 in response to the write signal PWMWR for the duty setting (FIG. 5, (e)). It should be noted that the configuration of FIG. 2 is designed such that data for cycle setting is temporarily stored in the duty setting register 32 first, and, then, is transferred from the duty setting register 32 to the cycle setting register 33.

As shown in FIG. 5, (g), the data of the cycle setting register 24 is updated to the second data (#01) after the first data (#00) is read therefrom. To this end, writing of data in the cycle setting register 24 is carried out in the manner as described with reference to the FIG. 4. By the same token, as shown in FIG. 5, (h), the data of the duty setting register 23 is updated to the second data (#01) after the first data (#00) is read therefrom. Writing of data in the duty setting register 23 in this regard is carried out in the manner as described with reference to the FIG. 4.

In this manner as described above, preparation for the next interruption signal is made. When the next interruption signal is supplied, the second data (#01) of the cycle setting register 24 and the duty setting register 23 are supplied to the PWM unit 22.

As described above, when there is a need to modify the pulse signal waveform in response to an external event, an interruption signal from the timer 12 is directly supplied to the PWM apparatus 10. In response, the PWM apparatus 10 supplies settings such as the duty setting and the cycle setting stored in the registers to the PWM unit 22, which is used to actually generate a pulse signal. This achieves a change in the PWM waveform of the output pulse signal. In this manner, it is possible to modify the PWM waveform at a desired timing indicated by an external event such as a trigger from the timer 12. The settings such as the duty setting and the cycle setting stored in the registers of the PWM apparatus 10 are supplied from the CPU 11 to the PWM apparatus 10 via the CPU bus 14 in response to an interruption signal issued by the timer 12, for example. In the first embodiment described above, the setting of data is made successively for the immediately following interruption.

Figure 6:
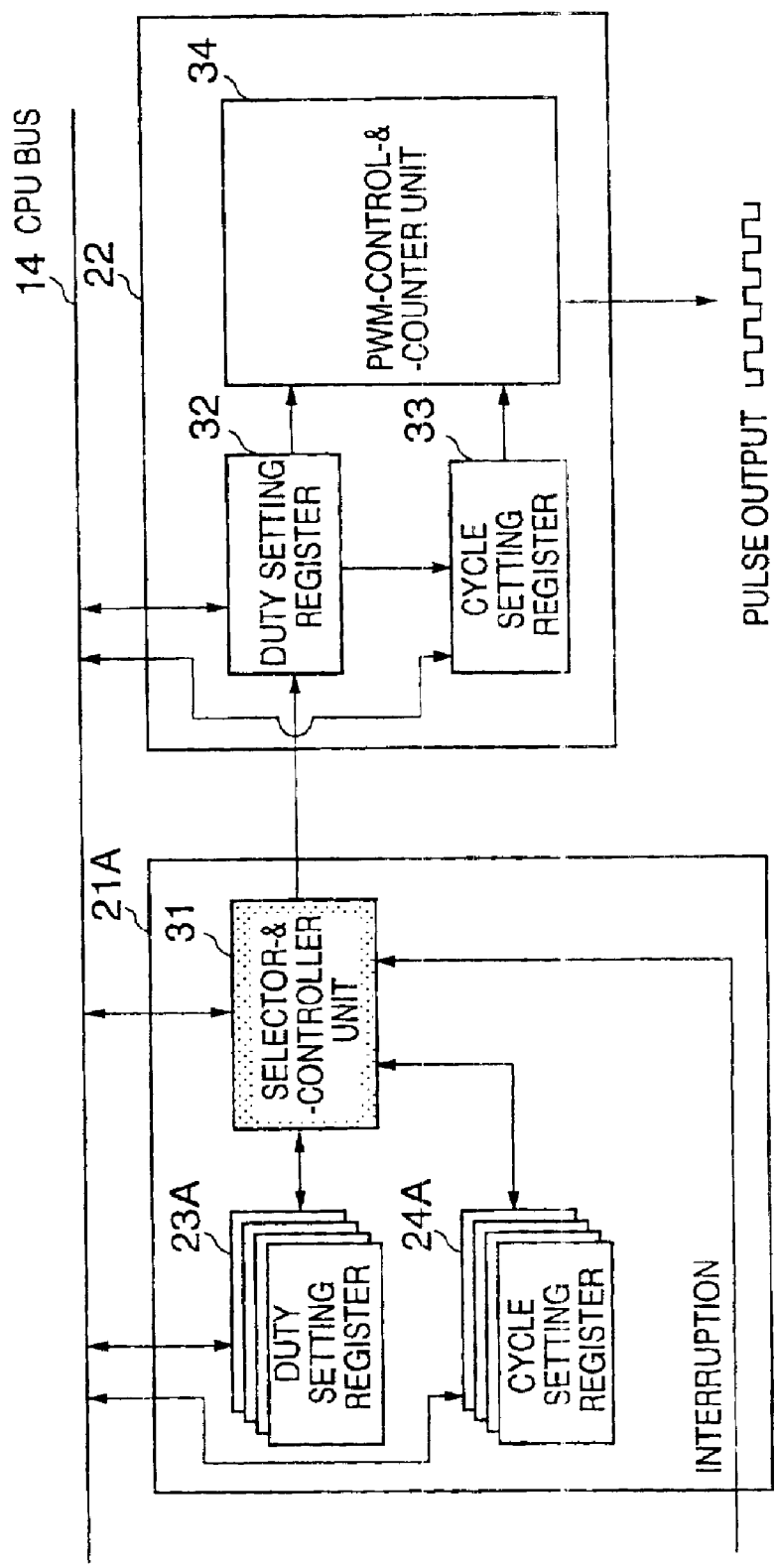
FIG. 6 is a block diagram of a second embodiment of the PWM apparatus according to the present invention.

FIG. 6 is a block diagram of a second embodiment of the PWM apparatus 10 according to the present invention. In FIG. 6, the same elements as those of FIG. 2 are referred to by the same numerals, and a description thereof will be omitted.

In the first embodiment described above, setting of data by the CPU is directed to data for the next and immediately following interruption. The second embodiment is configured such that data for a plurality of future interruptions are stored at once or successively in advance. To this end, the second embodiment of FIG. 6 has a duty setting register queue 23A and a cycle setting register queue 24A, which replace the duty setting register 23 and the cycle setting register 24, respectively.

The duty setting register queue 23A and the cycle setting register queue 24A may each be comprised of a FIFO (first-in first-out) or the like from which data is successively read in the same order as the data is successively stored. In this case, not only data for the next interruption but also data for the second next interruption, data for the third next interruption, etc., may be computed while there is no other load on the CPU 11, for example, and are stored in the duty setting register queue 23A and the cycle setting register queue 24A at once or successively in advance.

Alternatively, the duty setting register queue 23A and the cycle setting register queue 24A may each be comprised of a set of registers having respective addresses assigned thereto. In this case, as was in the case of FIFOs, not only data for the next interruption but also data for the second next interruption, data for the third next interruption, etc., may be computed while there is no other load on the CPU 11, for example, and are stored in the duty setting register queue 23A and the cycle setting register queue 24A at once or successively in advance. Unlike the configuration based on the use of FIFOs, data can be written by indicating a writing address. Because of this, after writing data for ten future interruptions, the data for the sixth through tenth future interruptions can be changed, for example, by specifying respective addresses if data changes become necessary upon situational changes.

In the case of the FIFO configuration, data that is supplied from the duty setting register queue 23A and the cycle setting register queue 24A to the PWM unit 22 by the selector-&-controller unit 31 is the data that is successively output from the FIFOs. In the case of the set-of-register configuration, means to indicate an address of next data may be provided by a counter or the like, and data of the register indicated by this address indicating means may be supplied successively from the duty setting register queue 23A and the cycle setting register queue 24A to the PWM unit 22.

The embodiments described above have been provided by way of illustration, and the present invention is not limited to the particular examples of these embodiments.

For example, the above description has been given with regard to a configuration in which an external event for triggering modification of the pulse signal waveform is an event of a timer. The external event is not limited to an event of a timer, but may include a signal that is supplied from an exterior of the system when a predetermined status or an interruption signal from an input/output interface is detected. Also, the external event may not be a periodic event, but may be a trigger that takes place at any timing.

Further, the present invention is not limited to these embodiments, but various variations and modifications may be made without departing from the scope of the present invention.

The present application is based on Japanese priority application No. 2000-346981 filed on Nov. 14, 2000, with the Japanese Patent Office, the entire contents of which are hereby incorporated by reference.

What is claimed is:

1. A device for generating a pulse signal, comprising:
   at least one first register which stores waveform data therein;
   a pulse signal generation unit which generates a pulse signal in accordance with the waveform data stored in said first register;
   a control unit which is connected to a bus and is controlled by control signals supplied from the bus; and
   a signal line which is separate from and independent of the bus and is connected to said control unit, wherein said control unit fetches update data for said first register from said bus based on said control signals and updates the waveform data of said first register with the update data in response to a signal externally supplied through said signal line, said update data comprising data corresponding to a period of the pulse signal and data corresponding to a duty ratio of the pulse signal.

2. The device as claimed in claim 1, wherein said control unit includes:
   a second register; and
   a controller which stores new waveform data in said second register in accordance with the control signals supplied from the bus, and transfers the new waveform data from said second register to said first register in response to the signal that is externally supplied through said signal line.

3. The device as claimed in claim 1, wherein said first register is connected to the bus, and is capable of storing therein waveform data that is supplied directly from the bus.

4. The device as claimed in claim 1, wherein the waveform data stored in said first register includes data of a pulse-signal cycle and data of a duty ratio.

5. The device as claimed in claim 2, wherein said second register is a register queue that stores therein a plurality of pieces of waveform data corresponding to a plurality of updatings of the waveform data stored in said first register.

6. The device as claimed in claim 5, wherein said register queue is a set of registers having respective addresses assigned thereto.

7. A device for generating a pulse signal, comprising;
   a CPU;
   a bus;
   a control unit which is connected to said bus, and is controlled by signals from said CPU;
   a signal line which is separate from and independent of said bus, and is connected to said control unit;
   a first register which stores therein waveform data;
   a pulse-signal generation unit which generates a pulse signal in accordance with the waveform data stored in said first register, wherein said control unit fetches update data for said first register from said bus responsive to said signals from said CPU and updates the waveform data of said first register with the update data in response to a signal externally supplied through said signal line, said update data comprising data corresponding to a period of the pulse signal and data corresponding to a duty ratio of the pulse signal.

8. The device as claimed in claim 7, wherein said control unit includes:
   a second register; and
   a controller which stores new waveform data in said second register according to control by said CPU, and transfers the new waveform data from said second register to said first register in response to the signal supplied through said signal line.

9. The device as claimed in claim 8, wherein said signal line is further connected to said CPU as an interruption signal line.

10. The device as claimed in claim 9, wherein said CPU controls said controller to store the new waveform data in said second register in response to an interruption signal supplied through the interruption signal line.

11. The device as claimed in claim 10, wherein said second register is a register queue that stores a plurality of waveform data corresponding to predetermined pulse signals and transfers one of said plurality of waveform data as the new waveform data to the first register successively in response to the interruption signal.

* * * * *